(12) United States Patent
Grayzel et al.

(10) Patent No.: US 12,052,002 B2
(45) Date of Patent: Jul. 30, 2024

(54) VERY NARROWBAND AND WIDEBAND NEGATIVE RESISTANCE AMPLIFIERS WITH A TUNEABLE CENTER FREQUENCY USING A COUPLER

(71) Applicants: Alfred Ira Grayzel, Park City, UT (US); Ashok Gorwara, New Market, MD (US)

(72) Inventors: Alfred Ira Grayzel, Park City, UT (US); Ashok Gorwara, New Market, MD (US)

( * ) Notice: Subject to any disclaimer, the term of this patent is extended or adjusted under 35 U.S.C. 154(b) by 0 days.

(21) Appl. No.: 18/475,553

(22) Filed: Sep. 27, 2023

(65) Prior Publication Data
US 2024/0039485 A1   Feb. 1, 2024

Related U.S. Application Data

(63) Continuation-in-part of application No. 17/873,838, filed on Jul. 26, 2022, now Pat. No. 11,863,131.

(51) Int. Cl.
| | | |
|---|---|---|
| H03F 1/56 | (2006.01) | |
| H03F 3/60 | (2006.01) | |
| H03H 7/01 | (2006.01) | |

(52) U.S. Cl.
CPC .............. *H03F 1/565* (2013.01); *H03F 3/60* (2013.01); *H03H 7/0115* (2013.01); *H03F 2200/451* (2013.01)

(58) Field of Classification Search
CPC .......... H03F 1/565; H03F 3/04; H03H 7/1741
USPC ...................................................... 330/61 A
See application file for complete search history.

(56) References Cited

U.S. PATENT DOCUMENTS

| | | | | |
|---|---|---|---|---|
| 3,160,826 A | * | 12/1964 | Marcatili ................... | H03F 3/12 330/56 |
| 3,208,003 A | * | 9/1965 | Sterzer ...................... | H03F 3/12 330/61 A |
| 4,025,872 A | * | 5/1977 | Grayzel .................... | H03F 3/10 330/61 A |
| 4,338,582 A | * | 7/1982 | Presser .................. | H03H 11/52 330/61 A |
| 11,863,131 B1 | | 1/2024 | Grayzel | |

(Continued)

OTHER PUBLICATIONS

Scanlan, et al., "A design theory of optimum broadband reflection amplifier", EEE Transactions on Microwave Theory and Techniques, vol. 12, Issue: 5, Sep. 1964, pp. 504-511. (Year: 1964).*

(Continued)

*Primary Examiner* — Hafizur Rahman
(74) *Attorney, Agent, or Firm* — Workman Nydegger

(57) ABSTRACT

A negative resistance amplifier including a negative resistance network where the negative resistance network may be any known circuit element characterized by a negative ratio of the voltage a between its output terminals and to the current flowing through the element: a reactance network resonant at the center frequency of the amplifier where the reactive network may contain a varactor for tuning of the resonant frequency of the reactance network: and a circulator whose port 1 is the input terminal of the amplifier, whose port 3 is the output port of the amplifier and whose port 2 is connected to the combination of the negative resistance network and the reactance network.

18 Claims, 12 Drawing Sheets

(56) References Cited

U.S. PATENT DOCUMENTS

2015/0236647 A1\* 8/2015 Grayzel .................. H03D 7/04
                                                              363/158
2023/0370034 A1\* 11/2023 Lloyd .................... H03F 3/604

OTHER PUBLICATIONS

"Synthesis of Negative Resistance Reflection Amplifiers, Employing Band-Limited Circulators", IEEE Transactions on Microwave Theory and Techniques, vol. 14, Issue: 7, Jul. 1966, pp. 323-337. (Year: 1966).\*

Amin et al., "Slow Wave Applications of Electromagnetically Induced Transparency in Microstrip Resonator", published in Scientific Reports, published on-line on Feb. 5, 2018 (Year: 2008).

Chin et al. "Quarter wavelength transmission line terminated in a short circuit such that at operating frequency the biasing transmission line offers open circuit at its input", published in IEEE Microwave and Wireless Components Letters, vol. 19, No. 3, Mar. 2009, pp. 155-157 (Year: 2009).

Final Office Action received for U.S. Appl. No. 17/873,838, mailed on Jan. 19, 2023, 11 pages.

Non-Final Office Action received for U.S. Appl. No. 17/873,838, mailed on Apr. 27, 2023, 7 pages.

Non-Final Office Action received for U.S. Appl. No. 17/873,838, mailed on Oct. 5, 2022, 10 pages.

\* cited by examiner

VERY NARROWBAND AND WIDEBAND NEGATIVE RESISTANCE AMPLIFIERS WITH A TUNEABLE CENTER FREQUENCY USING A COUPLER

CROSS-REFERENCE TO RELATED APPLICATIONS

This application is a continuation-in-part of U.S. patent application Ser. No. 17/873,838 filed on 26 Jul. 2022 and entitled "VERY NARROWBAND AND WIDEBAND NEGATIVE RESISTANCE AMPLIFIERS WITH A TUNEABLE CENTER FREQUENCY," which application is expressly incorporated herein by reference in its entirety.

BACKGROUND

Others have invented narrowband amplifiers using a conventional amplifier followed by a filter. Realizable filters of reasonable size have bandwidths greater than 5%. Conventional systems using prior art bandwidths as narrow as the amplifiers must use superconductors. Further, the negative resistance amplifier is well known but the ability to achieve narrow bandwidths by combining them with a reactance network is not.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

The present invention relates to an amplifier capable of achieving narrow bandwidths; bandwidths that are conventionally only obtainable using superconductors, which require cryogenic cooling. The center frequency of the amplifier according to the present invention can be tuned by incorporating varactors into the reactance network.

Amplifiers according to the present invention offer advantages over conventional amplifiers. These advantages include at least the following: (1) by being very narrow bandwidths without the use of superconductors, and/or (2) by being able to tune the center frequency.

Amplifiers according to the present invention in order to achieve very narrow bandwidths may utilize: (1) Negative resistance networks, (2) Reactance networks (the reactance networks can be comprised of but are not limited to a single or multiple series and shunt resonators), and/or (3) Circulators.

Amplifiers according to the present invention in order to achieve tuning capability for very narrow bandwidth or wide bandwidth amplifiers may utilize: (1) Negative resistance networks and/or (2) Reactance networks (the reactance networks can be comprised of but are not limited to a single or multiple series and shunt resonators), (3) Circulators, and/or (4) Varactors.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which:

FIG. 13 is a circuit diagram of an embodiment of a negative resistance amplifier which utilizes shunt and series resistors and the output circuit utilizes a 3 dB coupler.

FIG. 14 is a circuit diagram of an embodiment of as a negative resistance amplifier where the reactance network utilizes a shunt L-C resonator, a series resistor and the output circuit utilizes a 3 dB coupler.

FIG. 15 is a circuit diagram of an embodiment of a negative resistance amplifier where the reactance network utilizes a series L-C resonator, a shunt resistor and the output circuit utilizes a 3 dB coupler.

FIG. 16 is a circuit diagram of an embodiment of as a negative resistance amplifier where the resonant frequency of the reactance network is tunable and the output circuit utilizes a 3 dB coupler.

DETAILED DESCRIPTION

Figure 1:
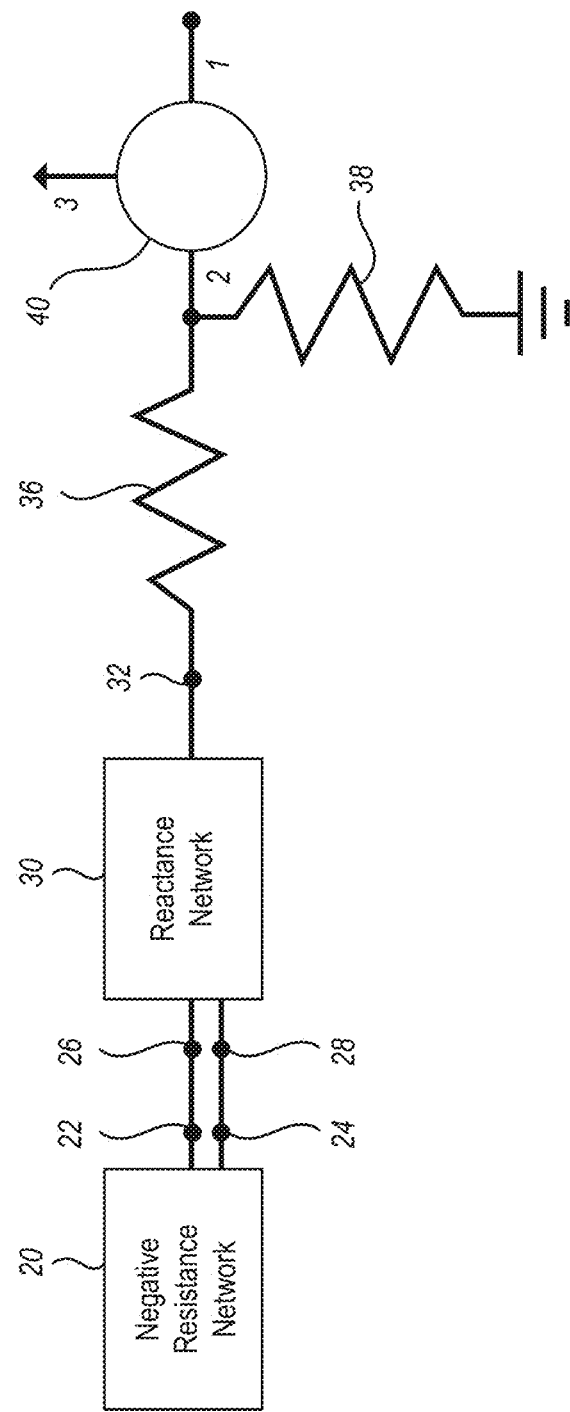
FIG. 1 shows in block diagram form a negative resistance amplifier.

FIG. 1 shows a schematic of a very narrowband amplifier according to the present invention. As used herein, a "very narrow bandwidth" may comprise a bandwidth less than 0.1%. The amplifier comprising a network 20 providing a negative resistance between its output terminals 22 and 24. Terminals 22 and 24 are connected to the input terminals 26 and 28 of reactance network 30. Output terminal 32 of reactance network 30 is connected to a resistor 36 which is connected to port 2 of circulator 40 and a resistor 38 which is connected to ground. Resistor 36 or resistor 38 or both may have a value of zero and can then be deleted. Circulator 40 has at least three ports. For a three port circulator, a substantially unidirectional signal path is provided between a first (or input) port 1 and a second (or intermediate) port 2 and between the second port 2 and a third (or output) port 3. When a signal with power P0 is applied to port 1 of the circulator and port 2 is terminated in an impedance Z2, the power at port 3 of the circulator is equal to P0 times the magnitude squared of the reflection coefficient at port 2, the reflection coefficient being equal to $|(Z0-Z2)/(Z0+Z2)|^2$, where Z0 is the characteristic impedance of the circulator. Port 1 of circulator 40 is the input terminal of the amplifier and port 3 is the output port of the amplifier. The negative resistance network 20 may be any known circuit element characterized by a negative ratio of the voltage as between its output terminals 22 and 24 to the current flowing through the element over a frequency range.

The amplifier shown in FIG. 1 operates as follows. When a signal with power Pin is delivered to port 1 of a circulator with characteristic impedance Z0 and terminal 2 terminated in an impedance ZL, the output power Pout at terminal 3 is equal to: $Pin|\rho|^2$, where $\rho$ the reflection coefficient is given by Eq. 1.

$$\rho=(Z0-ZL)/(Z0+ZL) \quad \text{Equation 1}$$

If ZL is a resistance of value Z0, $\rho$ is equal to zero and the output power Pout is equal to zero. If ZL is a reactance, $\rho$ is equal to 1.0 and the output power Pout is equal to Pin. If ZL is equal to a negative resistance $-RL$ then $\rho$ given by Eq. 2 is greater than one and the input power Pin will be amplified.

$$\rho=(Z0+RL)/(Z0-RL) \quad \text{Equation 2}$$

If for example ZL=−44.68 and Z0 equals 50 ohms then $|\rho|^2$=316.4 and Pout/Pin=25 dB where Pin is the input power introduced to port 1 of circulator 40 and Pout is the output power at port 3 of circulator 40.

Figure 2:
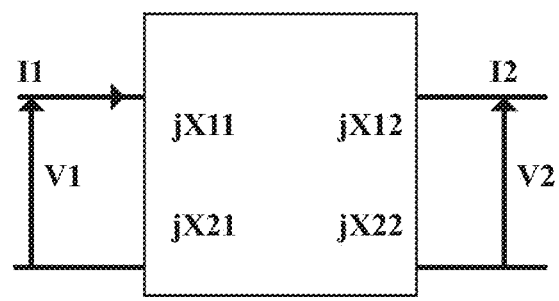
FIG. 2 shows in block diagram form a two port network defined by its impedance.

FIG. 2 shows a lossless two port network with an input port and an output port. It is characterized by jX11, jX12, jX21 and jX22, where jX11, jX12, jX21 and jX22 are defined by Equations 3a and 3b.

$$V1=(I1)jX11+I2(jX12) \quad \text{Equation 3a}$$

$$V2=(I1)jX21+I2(jX22) \quad \text{Equation 3b}$$

The input voltage V1, the output voltage V2, the input current I1 and the output current I2 are as show in FIG. 2. For a reciprocal network X21=X12.

If the network of FIG. 2 is terminated in a resistance Rout then V2=−(I2)Rout and solving Eqs. 3a and 3b one finds that the input impedance Rin+ is given by Eq. 4.

$$Rin+=jX11+(Rout(X12)^2-jX12^2(X22))/(Rout^2+X22^2)$$
$$=R2+jX2 \quad \text{Equation 4}$$

Where R2 and X2 are the real and imaginary parts of the input impedance Rin+ when the two port is terminated in Rout. If the network of FIG. 2 is terminated in a resistance −Rout then the input impedance Rin− is given by Equation 5.

$$Rin-=jX11+(-Rout(X12)^2-jX12^2(X22))/(Rout^2+X22^2) \quad \text{Equation 5}$$

It can be seen from Equations 4 and 5 that Rin−=−R2+jX2.

Substituting Equation 4 into Equation 2 one finds that the reflection coefficient $\rho+$ when the network of FIG. 2 is terminated in Rout is given in Eq. 6.

$$\rho+=((Z0-R2)-jX2)/((Z0+R2)+jX2) \quad \text{Equation 6}$$

Substituting Equation 5 into Equation 2 one finds that the reflection coefficient $\rho-$ when the network of FIG. 2 is terminated in −Rout is given in Equation 7.

$$\rho-=((Z0+R2)-jX2)/((Z0-R2)+jX2) \quad \text{Equation 7}$$

and that $$|\rho-|^2=1/|\rho+|^2 \quad \text{Equation 8}$$

If the two port network of FIG. 2 has a monotonic attenuation characteristic, is resonant at frequency F0 and is designed for an impedance level of 44.68 ohms then when it is terminated in a negative resistance of −44.68, Eq. 2 yields $|\rho-|^2$=316.2. If the amplifier in FIG. 1 utilizes the two port shown in FIG. 2, for reactance network 30, the value of the negative resistance network is −44.68 and resistor 36 and resistor 38 are deleted the amplifier will have a gain of 25 dB at F0. If the two port network when terminated in 44.68 ohms has an attenuation of −3 db ($|\rho+|^2$=½) at F1 and F2, then at F1 and F2 $|\rho-|^2$=2. The gain of the amplifier will then be 3 dB at F1 and F2. The attenuation of the negative resistance amplifier at F1 and F2 is therefore 22 dB below the gain at F0. If at frequencies Fb and Fa the gain of the negative resistance amplifier is 22 dB; 3 dB below the gain of the amplifier at F0, then Fa and Fb define the edges of the 3 dB bandwidth of the negative resistance amplifier. The bandwidth of the amplifier is then equal to Fb−Fa. The gain of the amplifier at Fb and Fa equals 22 dB and hence $|\rho-|^2$=158.5 for this case and Equation 8 yields $|\rho+|^2$=1/158.5=0.0063 at these frequencies. The bandwidth edges of the amplifier Fa and Fb are therefore equal to the frequencies where $|\rho+|^2$=0.0063. If the reactance network 30 is a filter such as the Butterworth filter this result is independent of the number of sections of the filter. Since more sections yield a flatter filter response the amplifiers bandwidth will increase with the increasing number of sections since $|\rho+|^2$=0.0063 will occur at frequencies which are further from F0. One or two sections should therefore be used for narrow bandwidths. Multi-section filters can be used for wider bandwidths.

Figure 3:
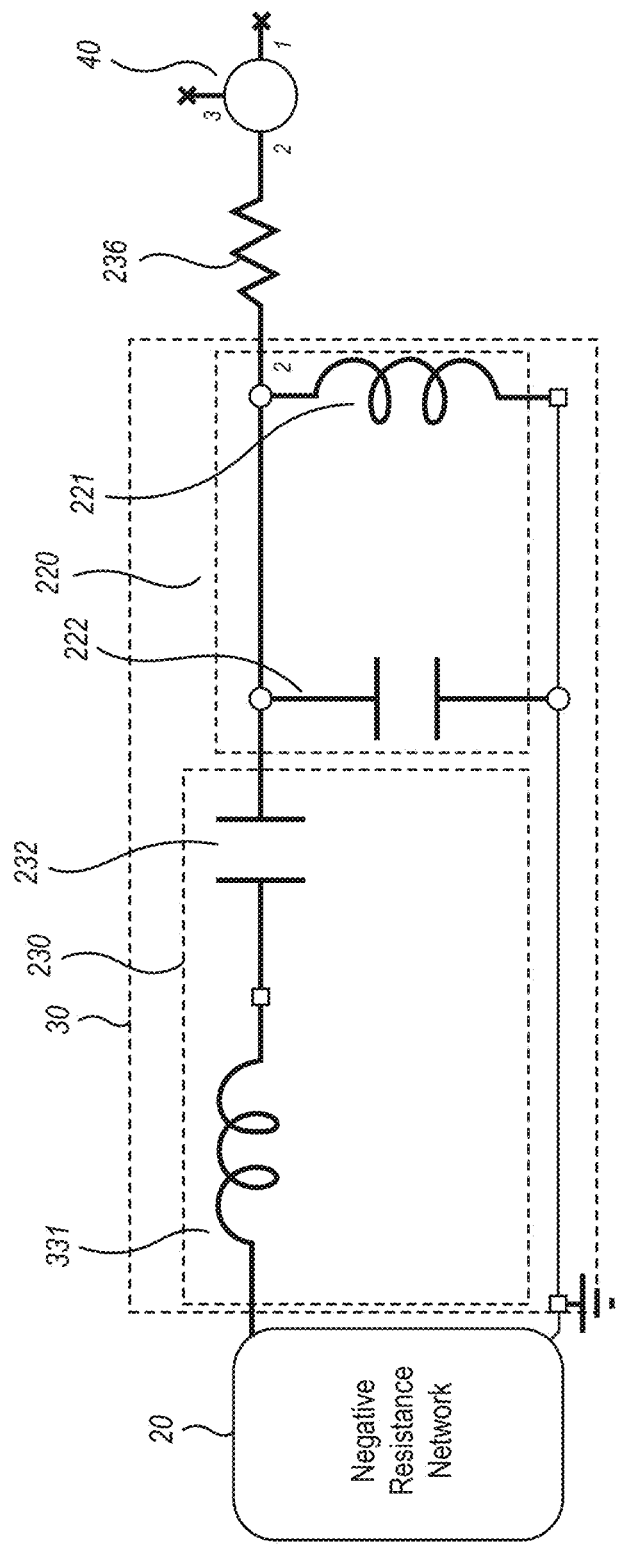
FIG. 3 is a circuit diagram of an embodiment of a negative resistance amplifier where the reactance network utilizes L-C resonators.
Figure 4:
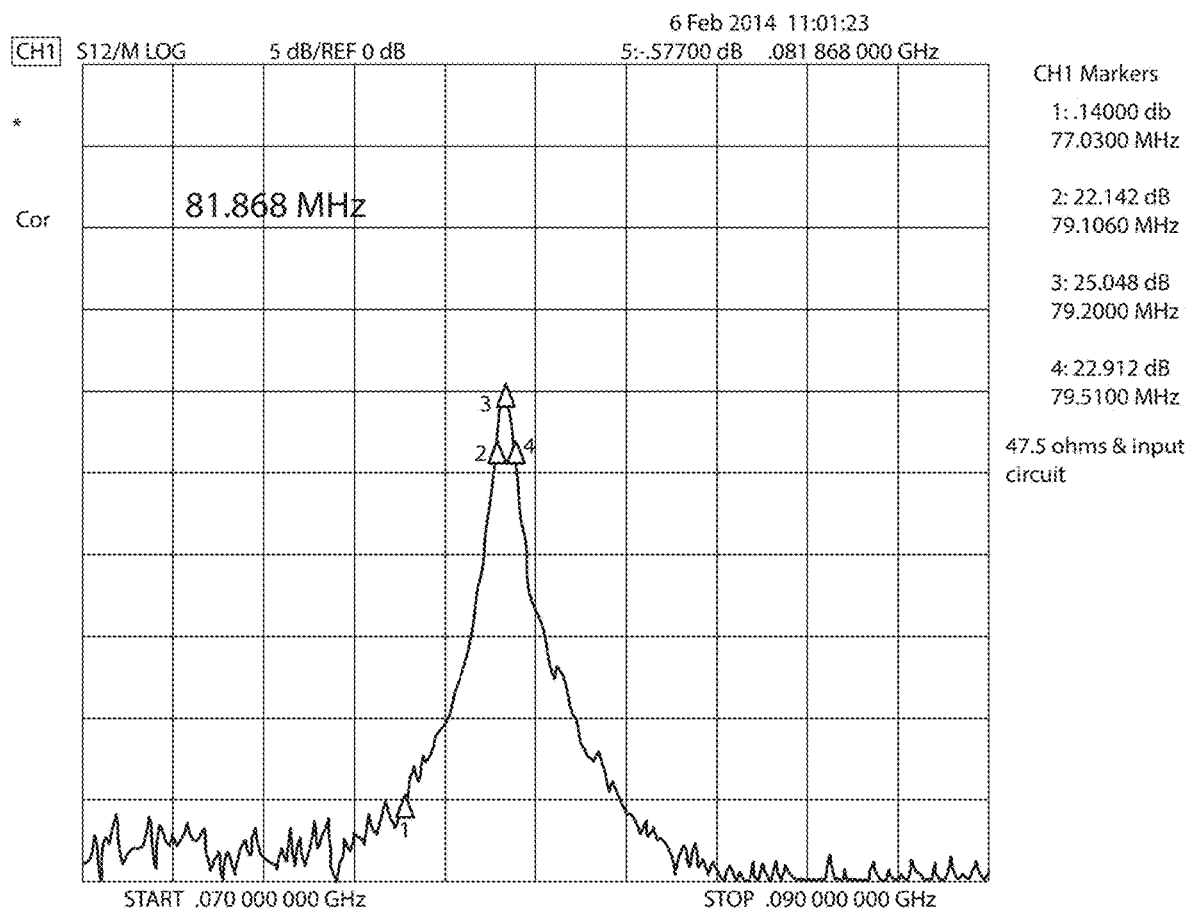
FIG. 4 shows the results of measurements of the amplifier's gain as a function of frequency of the circuit of FIG. 3.

FIG. 3 shows an embodiment of the invention of the amplifier in FIG. 1 which can be used to realize narrow or wideband negative resistance amplifiers. For this embodiment negative resistance network 20 has a value of −94.68 ohms and is connected to a series resonator 230 which is resonant at 81.87 MHz, comprising a 50.4 pf capacitor 232 and a 75 nh inductor 221. Series resonator 230 is connected to a shunt resonator 220, which is resonant at 81.87 MHz, comprising a 1.7 mfd capacitor 222 and a 2.22 nh inductor 221. A 50 ohm resistor 236 is connected between shunt resonator 220 and port 2 of circulator 40. Negative resistance network 20 has a value equal to −94.68 ohms. The series connection of the negative resistance of −96.68 ohms and the 50 ohm resistor 236 yields a negative impedance of −44.68 ohms and therefore the negative resistance amplifier has a gain of 25 dB at frequency F0. This combination yields a narrower bandwidth for the amplifier, since at frequencies differing from F0 shunt resonator 220 approximates a short circuit; terminating port 2 of the circulator 40 in approximately 50 ohms and hence greater attenuation. This circuit was built and tested where the negative resistance 20 was realized using an operational amplifier with appropriate feedback. Measured results are shown in FIG. 4. The bandwidth of the amplifier is 410 KHz a 0.5% bandwidth.

Figure 5:
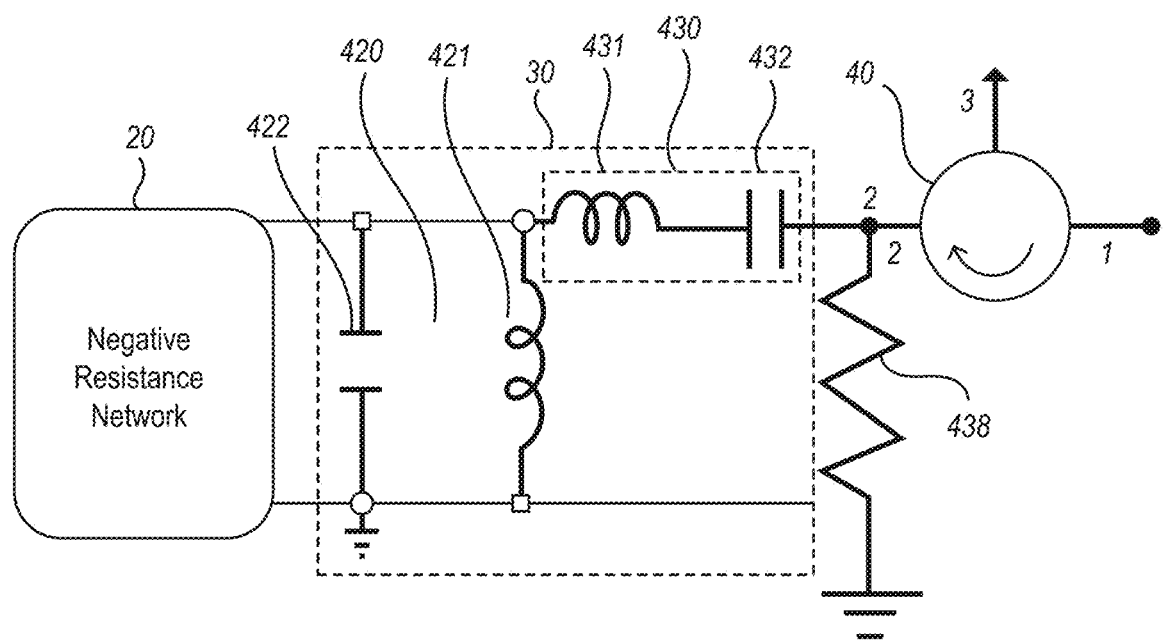
FIG. 5 is a circuit diagram of an embodiment of as a negative resistance amplifier where the reactance network utilizes L-C resonators.
Figure 6:
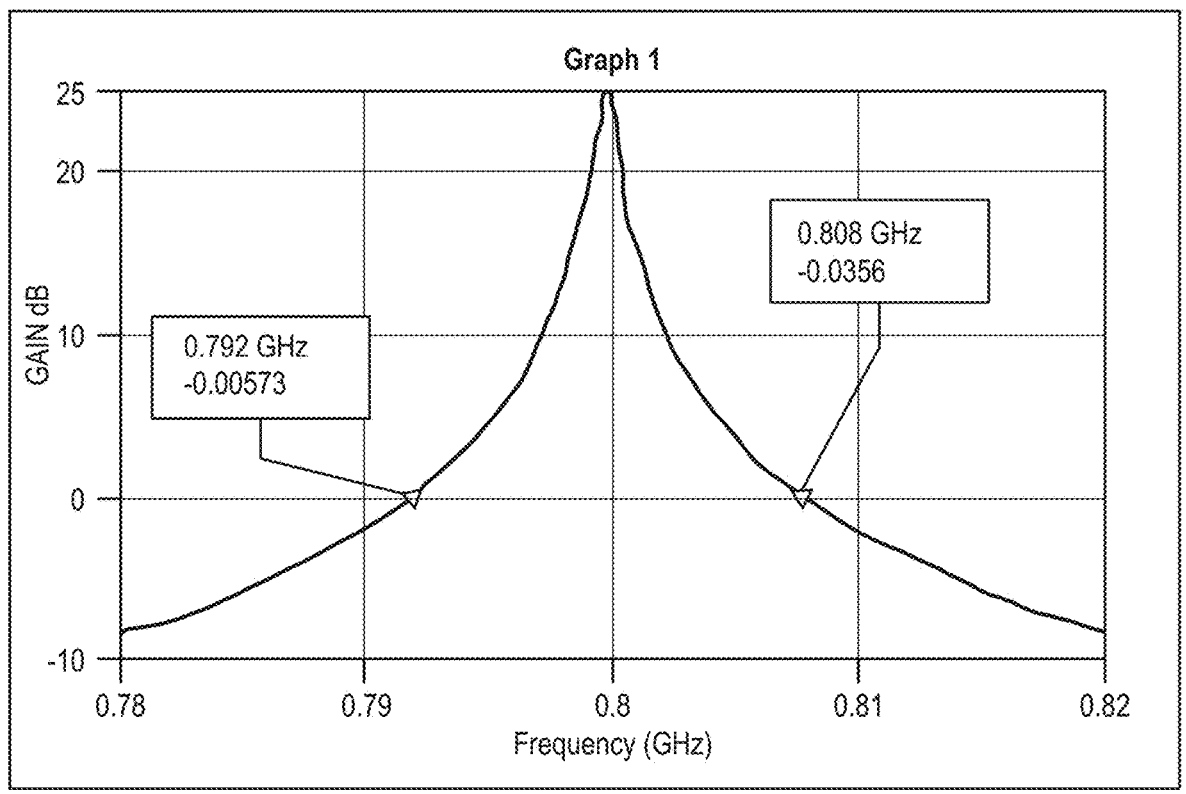
FIG. 6 shows the results of computer analysis of the amplifier's gain as a function of frequency of the circuit of FIG. 5.

FIG. 5 shows an alternative embodiment of the invention of the amplifier in FIG. 1 which can be used to realize narrow or wideband negative resistance amplifiers. For this embodiment, negative resistance network 20 with a value of −23.6 is connected to reactance network 30 which is realized by a shunt resonator 420, which is resonant at 800 MHz, comprising of a 96.5 pf capacitor 422 and a 0.41 nh inductor 421. Shunt resonator 420, is connected to a series resonator 430 which is resonant at 800 MHz, comprising of a 0.066 pf capacitor 432 and a 600 nh inductor 431. Series resonator 430 is connected to a 50 ohm resistor 438 which is connected to ground and to port 2 of circulator 40. The 50 ohm resistor 438 in parallel with −23.6 ohms yields a negative resistance of −44.68 ohms at F0. Setting the value of the negative resistance network 20 equal to −23.6 and the value of resistor 438 equal to 50 ohms results in a narrower bandwidth for the amplifier since at frequencies differing from F0 the series resonator approximates an open circuit; terminating port 2 of the circulator 40 in approximately 50 ohms. This circuit was computer analyzed using "Microwave Office". The results are plotted in FIG. 6. The bandwidth was found to be equal to 914 KHz or a 0.114% bandwidth. The gain falls to zero at a deviation from the center frequency of 8 MHz or 1%.

Figure 7:
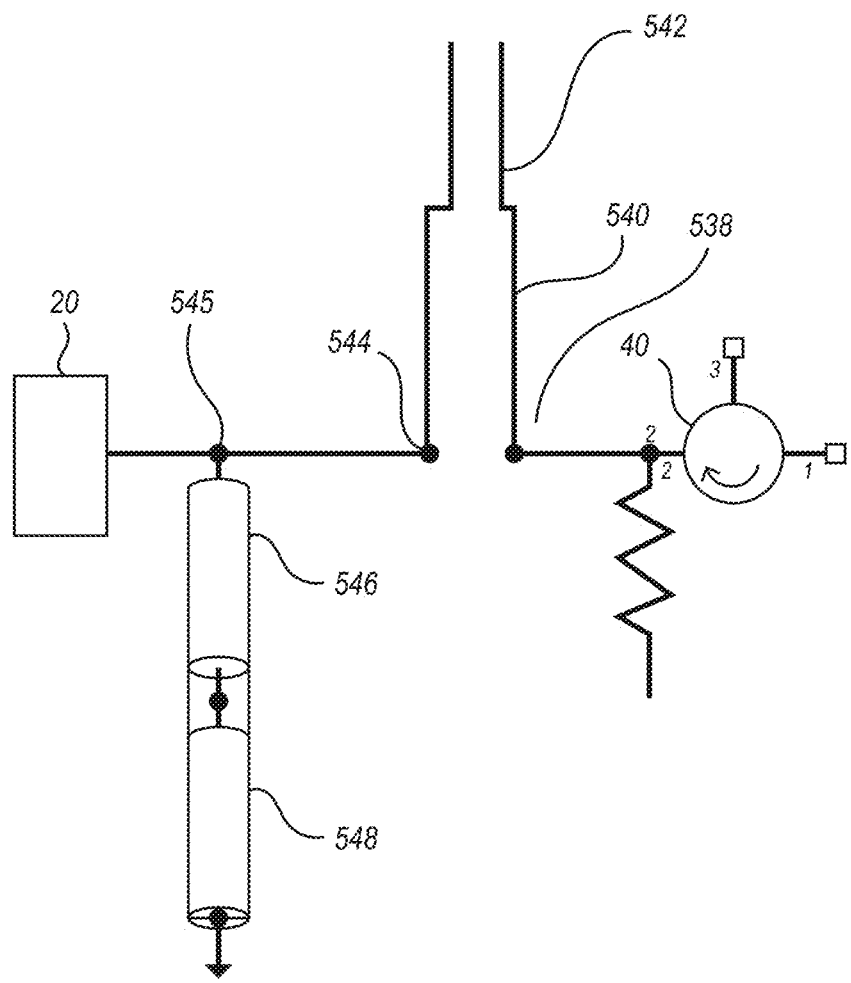
FIG. 7 is a circuit diagram of an embodiment of a negative resistance amplifier where the reactance network utilizes transmission line resonators.

FIG. 7 shows an alternative embodiment of the invention of the amplifier in FIG. 1 which can be used to realize narrow or wideband negative resistance amplifiers. This embodiment utilizes transmission lines resonators. Port 2 of circulator 40 is connected to the input port 538 of a series connected transmission line 540 which has a characteristic impedance Z01 and length L1 and is terminated in an open circuited transmission line 542 which has a characteristic impedance Z02 and length L2, such that series connected transmission line 540 terminated in transmission line 542 is resonant at F0. If Z01 equals Z02 then transmission lines 540 and 542 degenerate into a single transmission line of length L1+L2. The output port 544 of transmission line 540 is connected to the input port 545 of a shunt connected transmission line 546 which has a characteristic impedance Z03 and length L3, and is terminated in a short circuited transmission line 548 which has a characteristic impedance Z04 and length L4, such that shunt connected transmission line 546 terminated in transmission line 548 is resonant at F0. The input port 545 of transmission line 546 is connected to negative resistance network 20. The resultant amplifier has a center frequency F0.

Figure 8:
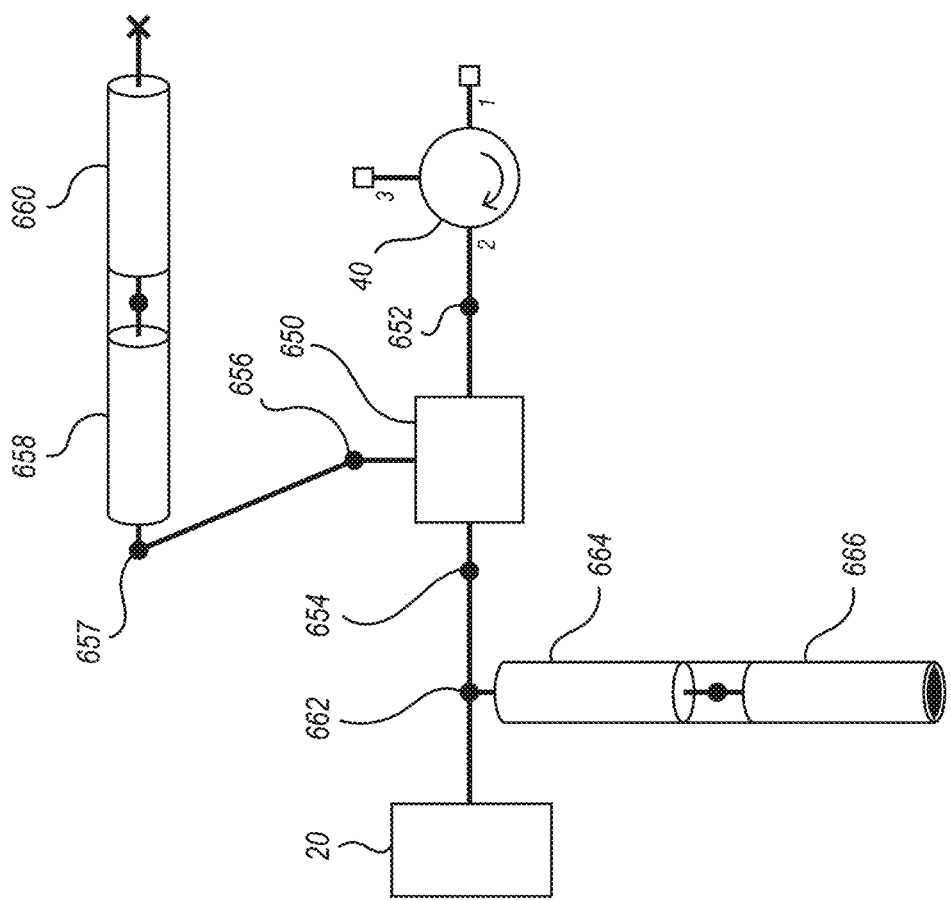
FIG. 8 is a circuit diagram of a negative resistance amplifier where the reactance network utilizes a balun in conjunction with transmission line resonators.

FIG. 8 shows an alternative embodiment of the invention of the amplifier in FIG. 1 which can be used to realize narrow or wideband negative resistance amplifiers. This embodiment utilizes transmission lines resonators and a balun to effect the series connection of the series transmission line. Port 2 of circulator 40 is connected to a balanced port 652 of balun 650, balun 650 having balanced ports 652 and 654 and unbalanced port 656. Unbalanced port 656 is connected to the input port 657 of transmission line 658 which has a characteristic impedance Z01 and length L1, and which terminated in on open circuited transmission line 660, which has a characteristic impedance Z02 and length L2, such that series connected transmission line 658 terminated in on open circuited transmission line 660 is resonant at F0. Balanced port 654 is connected to the input port 662 of a shunt connected transmission line 664 which has a characteristic impedance Z03 and length L3 and is terminated in a short circuited transmission line 666 which has a characteristic impedance Z04 and length L4, such that shunt connected transmission line 664 terminated in short circuited transmission line 666 is resonant at F0. Input terminal 662 of transmission line 664 is connected to negative resistance network 20. The resultant amplifier has a center frequency F0.

Figure 9:
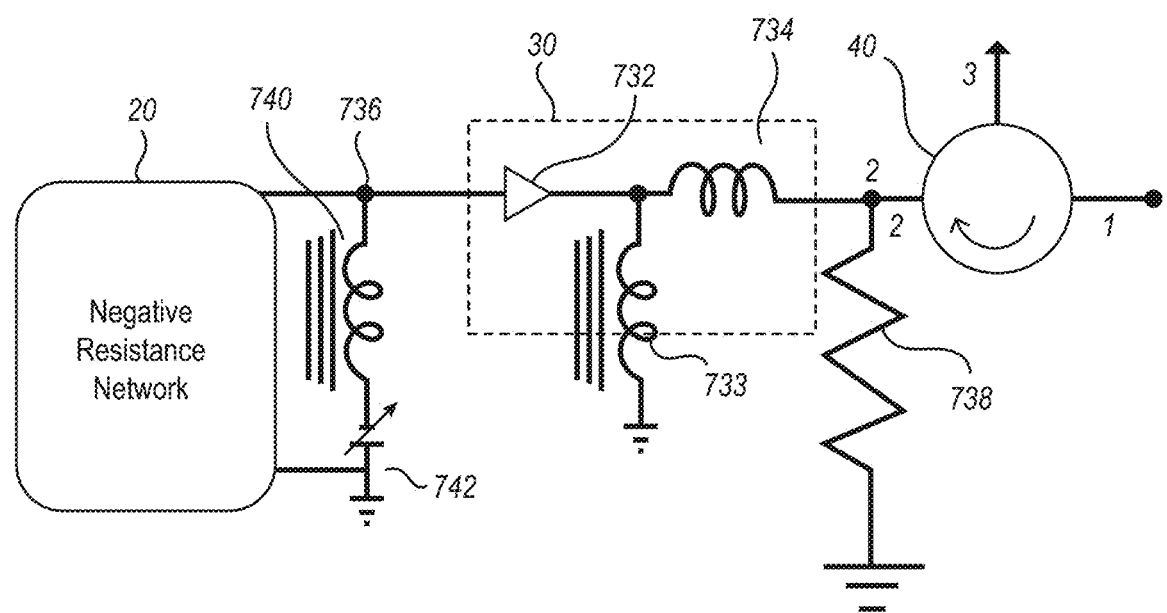
FIG. 9 is a circuit diagram of an embodiment of my invention as a negative resistance amplifier according to the invention where a varactor is included in the reactance network.

FIG. 9 shows an embodiment of the invention of the amplifier which can be used to realize tunable narrow or wideband negative resistance amplifiers. Reactance network 30 is realized by the series connection of a varactor 732 and an inductor 734. Inductor 734 is connected between port 2 of circulator 40 and varactor 732. A variable DC voltage supply 742 is connected through an RF choke 740 to varactor 732. An RF choke is connected between the junction of varactor 732 and inductor 734 and ground. Negative resistance network 20 is connected to the junction of varactor 732 and RF choke 740. A 50 ohm resistor is connected between port 2 of circulator 40 and ground. Varying the dc voltage of DC voltage supply 742 varies the center frequency of the amplifier.

Figure 10:
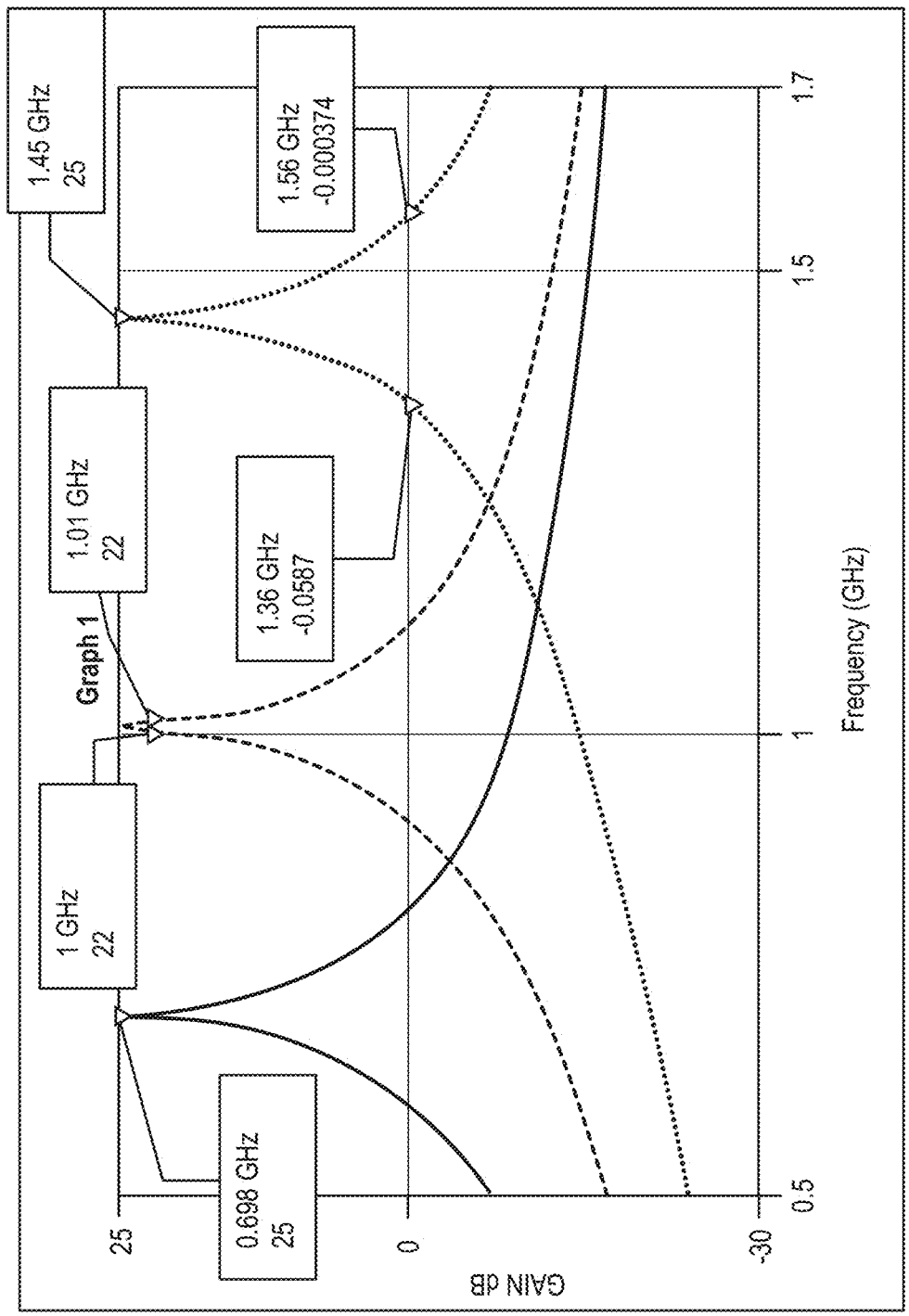
FIG. 10 shows the results of computer analysis of the amplifier's gain as a function of frequency, of one example of the circuit of FIG. 9 where the varactor is tuned across its range.

Computer analysis of three cases was performed using "Microwave Office". In all cases varactor 732 was assumed to be model GVD1203 manufactured by Sprague Goodman which has a tuning range from 0.6 pf to 2.5 pf. In the first case negative resistance network had a value of −23.6 ohms and the inductor 734 was set to 20 nh. The result is shown in FIG. 10, where varactor 732 was tuned over its range. The center frequency of the amplifier varied from 698 MHz to 1.45 GHz, while the gain remained constant at 25 dB and the bandwidth remained approximately constant at 11 MHz. This corresponds to a 1.1% bandwidth at 1.0 GHz.

Figure 11:
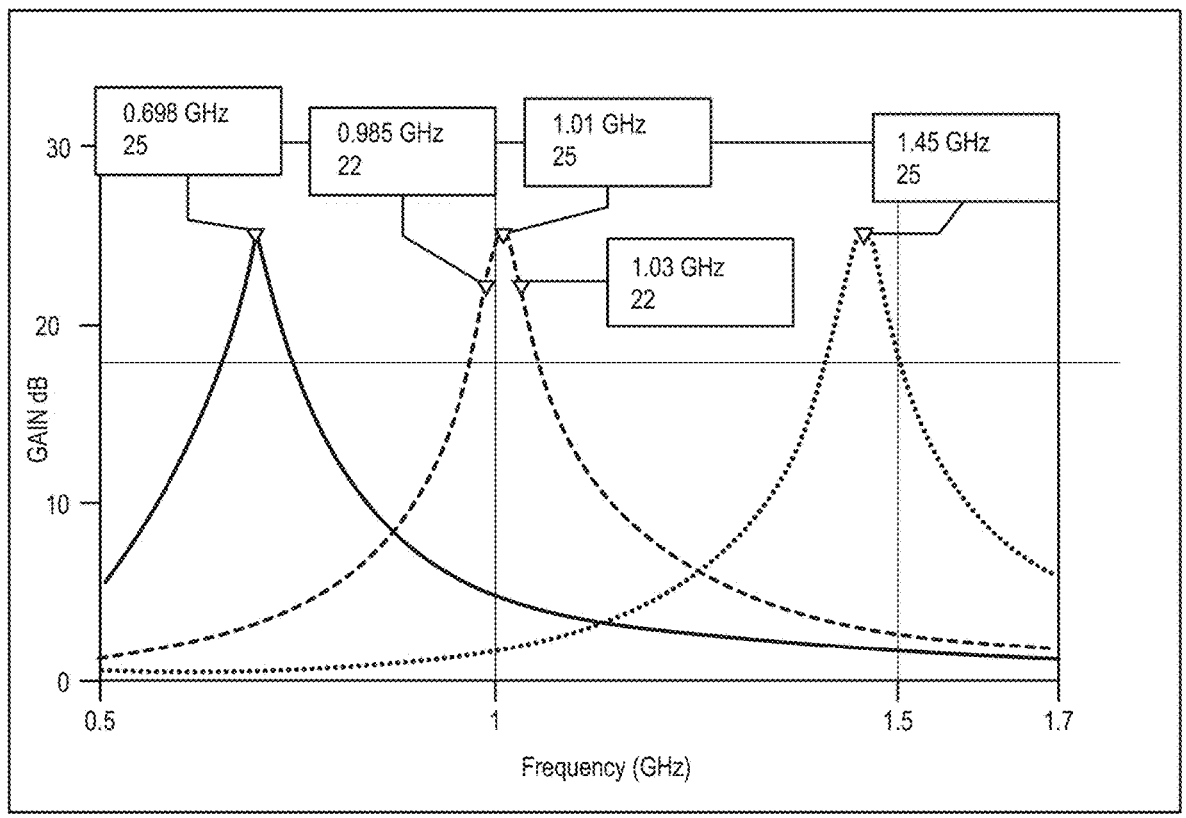
FIG. 11 shows the results of computer analysis of the amplifier's gain as a function of frequency of a second example of the circuit of FIG. 9 where the varactor is tuned across its range.

In the second case the negative resistance network had a value of −23.6 ohms and inductor 734 was set to 2.64 nh. The result is shown in FIG. 11 where varactor 732 was tuned over its tuning range. The center frequency of the amplifier varied from 2 GHz to 4.0 GHz. The gain remained constant at 25 dB and the bandwidth remained constant at 8 MHz. This corresponds to a 0.27% bandwidth at 3.0 GHz.

Figure 12:
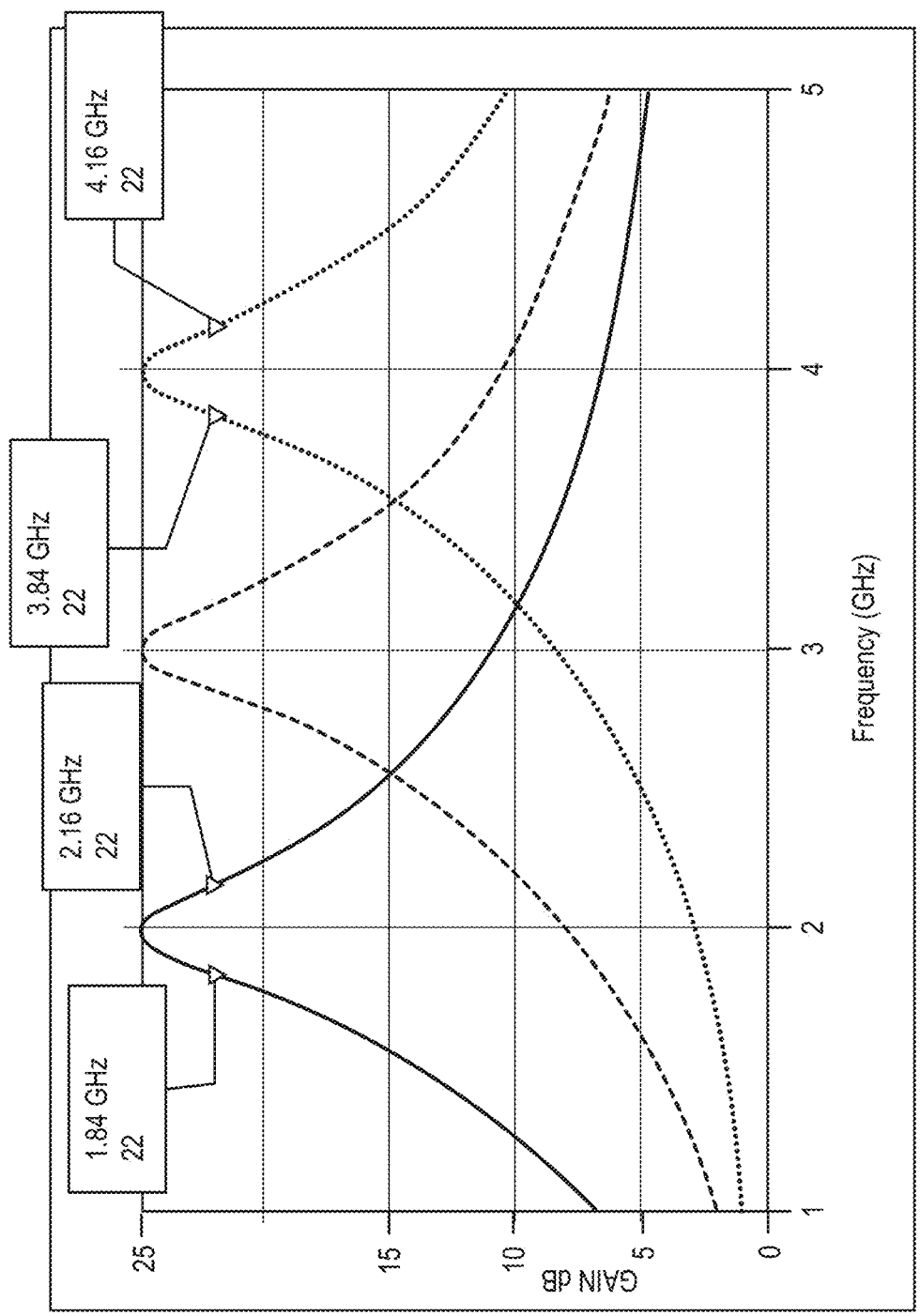
FIG. 12 shows the results of computer analysis of the amplifier's gain as a function of frequency of a third example of the circuit of FIG. 9 where the varactor is tuned across its range.

In the third case the negative resistance network had a value of −44.68 ohms, inductor 734 was set to 2.64 nh and resistor 738 was deleted. The result is shown in FIG. 12 where varactor 732 was tuned over its tuning range. The center frequency of the amplifier varied from 2 GHz to 4.0 GHz. The gain remained constant at 25 dB and the bandwidth remained constant at 320 MHz. This corresponds to a 10.67% bandwidth at 3.0 GHz. Thus for wide bandwidths resistors 738 should be deleted, as should resistor 38 in FIG. 1.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

FIG. 13 shows a schematic of a very narrowband amplifier according to embodiments of the present invention. The amplifier comprises two identical networks 800 each comprising a network 820 providing a negative resistance between its output terminals 822 and 824. The negative resistance network 820 may be any known circuit element characterized by a negative ratio of the voltage as between its output terminals 822 and 824 to the current flowing through the element over a frequency range. Terminals 822 and 824 are connected to the input terminals 826 and 828 of reactance network 830. Output terminal 832 of reactance network 830 is connected one end of a shunt resistor 838 where the other end of resistor 838 is connected to ground and to one end of a series resistor 836 where the other is connected to the output port 840 of the network 800. Resistor 836 may have a value of zero in which case it can then be deleted. Resistor 838 may have a value of infinity in which case it can then be deleted. Output port 840 of one of the identical networks 800 is connected to port 2 of a 3 dB directional coupler 860 and port 840 the other identical networks 800 is connected to port 4 of the 3 dB directional coupler. The 3 dB directional coupler 860 has four ports. Port 1 is the input port, port 2 is the coupled port, port 4 is the isolated port and port 3 is the output port of the 3 dB directional coupler 860. When a signal with power P0 is applied to port 1 of the 3 dB directional coupler 860 and port 2 and port 4 are terminated in identical networks, the output power at port 3 of the 3 dB directional coupler 840 is equal to P0 times the magnitude squared of the reflection coefficient at port 2 and port 4, the reflection coefficient being equal to $|(Z0-Z2)/(Z0+Z2)|^2$, where Z0 is the characteristic impedance of the 3 dB directional coupler 860 and Z2 is the impedance of the networks connected to ports 2 and 4. Port 1 of 3 dB directional coupler 860 is the input terminal of the amplifier and port 3 is the output port of the amplifier. The amplifier shown in FIG. 13 operates as follows:

A negative resistance amplifier can utilize a circulator or a 3 dB directional coupler and have the same performance. The circuit of FIG. 13 will thus have the same performance as the circuit of FIG. 1. If the circulator is replaced by a 3 dB directional coupler in FIGS. 3, 5, 7, 8, 9 the resulting circuits will have the same narrowband characteristics as the circuits shown in FIGS. 3, 5, 7, 8, 9.

FIG. 14 shows an embodiment of the invention of the amplifier in FIG. 13 which can be used to realize narrow or wideband negative resistance amplifiers. The amplifier comprises two identical networks 900 each comprising a network 920 providing a negative resistance between its output terminals 922 and ground. The negative resistance network 920 may be any known circuit element characterized by a negative ratio of the voltage as between its output terminals 922 and ground to the current flowing through the element over a frequency range. For this embodiment negative resistance network 920 has a value of −94.68 ohms and is connected to the input terminal 926 of shunt resonator 925, which is resonant at 81.87 MHz, comprising a 1.7 pf capacitor 922 and a 2.22 nh inductor 921. A 50 ohm resistor 936 is connected between the output terminal 932 of shunt resonator 925 and the output terminal 938 of network 900. The output terminal of one of the identical networks is connected to port 2 of a 3 dB directional coupler 960 and output port 938 of the other identical network 900 is connected to port 4 of the 3 dB directional coupler. The 3 dB directional coupler 960 has four ports. Port 1 is the input port, port 2 is the coupled port, port 4 is the isolated port and port 3 is the output port of the 3 dB directional coupler 960. Port 1 of 3 dB directional coupler 960 is the input terminal of the amplifier and port 3 is the output port of the amplifier. Negative resistance network 920 has a value equal to −94.68 ohms. The series connection of the negative resistance of −96.68 ohms and the 50 ohm resistor 936 yields a negative impedance of −44.68 ohms and therefore the negative resistance amplifier has a gain of 25 dB at frequency F0. Computer analysis shows that the circuit of FIG. 14 has a 400 KHz bandwidth at 22 dB; 3 dB down from the center frequency gain of 25 dB.

FIG. 15 shows an embodiment of the invention of the amplifier in FIG. 13 which can be used to realize narrow or wideband negative resistance amplifiers. The amplifier comprises of two identical networks 1000 each comprising a network 1020 providing a negative resistance between its output terminals 1022 and ground. The negative resistance network 1020 may be any known circuit element characterized by a negative ratio of the voltage as between its output terminal 1022 and ground to the current flowing through the element over a frequency range. For this embodiment negative resistance network 1020 has a value of −23.6 ohms and is connected to the input terminal 1026 of a series resonator 1025, which is resonant at 800 MHz, comprising a 96.5 pf capacitor 1030 and a 0.41 nh inductor 1031. A 50 ohm resistor 1036 is connected between series resonator 1025 and ground. The output terminal 1032 of one of the identical networks is connected to port 2 of a 3 dB directional coupler 1060 and output port 1032 of the other identical network 1000 is connected to port 4 of the 3 dB directional coupler. The 3 dB directional coupler 1060 has four ports. Port 1 is the input port, port 2 is the coupled port, port 4 is the isolated port and port 3 is the output port of the 3 dB directional coupler 1060. Port 1 of 3 dB directional coupler 1060 is the input terminal of the amplifier and port 3 is the output port of the amplifier. Negative resistance network 1020 has a value equal to −23.6 ohms. The shunt connection of the negative resistance of −23.6 ohms and the 50 ohm resistor 1036 yields a negative impedance of −44.68 ohms at frequency F0 and therefore the negative resistance amplifier has a gain of 25 dB at frequency F0. This circuit was computer analyzed using "Microwave Office" and the bandwidth at a gain of 22 dB; 3 dB below the gain at F0, was found to be equal to 944 KHz.

FIG. 16 shows an embodiment of the invention of the amplifier in FIG. 13 which can be used to realize narrow or wideband negative resistance amplifiers. The amplifier comprising two identical networks 1100 each comprising a network 1120 providing a negative resistance between its output terminals 1122 and ground. Output terminals 1122 is connected to the input terminal 1126 of a reactance network 1125. Reactance network 1125 is comprised of a varactor 1130, connected to an inductor 1131 and a choke 1129 which is connected between the junction of varactor 1130 and inductor 1131 and ground. A variable DC voltage source 1127 is connected through an RF choke 1128 to terminal 1126. A resistor 1136 is connected between the output terminal 1132 of reactance network 1125 and ground. The output terminal 1132 of one of the identical networks is connected to port 2 of a 3 dB directional coupler 1160 and output port 1132 of the other identical network 1100 is connected to port 4 of the 3 dB directional coupler. The 3 dB directional coupler 1160 has four ports. Port 1 is the input port, port 2 is the coupled port, port 4 is the isolated port and port 3 is the output port of the 3 dB directional coupler 1160. Port 1 of 3 dB directional coupler 1160 is the input terminal of the amplifier and port 3 is the output port of the amplifier.

In this embodiment negative resistance network 1120 has a value equal to −23.6 volts, resistor 1136 has a value of 50 ohms and inductor 1131 has a value of 20 nh. The shunt connection of the negative resistance of −23.6 ohms and the 50 ohm resistor 1036 yields a negative impedance of −44.68 ohms at frequency F0 and therefore the negative resistance amplifier has a gain of 25 dB at frequency F0.

Computer analysis was performed using "Microwave Office". Varactor 1130 was assumed to be model GVD1203 manufactured by Sprague Goodman which has a tuning range from 0.6 pf to 2.5 pf. The result is shown in FIG. 10, where varactor 1130 was tuned over its range. The results are the same for this embodiment as for the embodiment shown in FIG. 9. The center frequency of the amplifier varied from 698 MHz to 1.45 GHz, while the gain remained constant at 25 dB and the bandwidth remained approximately constant at 11 MHz. This corresponds to a 1.1% bandwidth at 1.0 GHz.

What is claimed is:

1. An amplifier comprising:
   a negative resistance network comprising a network characterized by a negative ratio of a voltage between output terminals of the negative resistance network and to a current flowing out of the output terminals of the negative resistance network, over a frequency band including F0, where one terminal of the negative resistance network can be connected to ground and the other terminal of the negative resistance network then designated as the output terminals of the negative resistance network;
   a circulator comprising at least three ports, the at least three ports including an input port, an output port and a control port wherein an impedance connected to the control port determines a gain of the amplifier;
   a reactance network connected between the control port of the circulator and the output terminals of the negative resistance network, wherein the reactance network is configured to be resonant at F0; and
   wherein:
      the reactance network is configured such that a signal at the input port of the circulator will be amplified, and
      the reactance network comprises a series resonator comprised of a balun with its balanced ports connected to between the control port and one output terminal of the negative resistance network the other output terminal grounded, and an unbalanced port connected to a transmission line which has a characteristic impedance Z01 and length L1, terminated in on open circuited transmission line which has a characteristic impedance Z02 and length L2, such that series connected transmission line terminated in short circuited transmission line presents a short circuit at its input at frequency F0.

2. An amplifier comprising:
   a negative resistance network comprising a network characterized by a negative ratio of a voltage between output terminals of the negative resistance network and to a current flowing out of the output terminals of the negative resistance network over a frequency band including F0, where one terminal of the negative resistance network can be connected to ground and the other terminal of the negative resistance network then designated as the output terminal of the negative resistance network;
   a circulator comprising at least three ports, the at least three ports comprising an input port, an output port, and a control port, wherein an impedance connected to the control port determines a gain of the amplifier;
   a series physical resistor or combination of physical resistors with one end connected to the control port of the circulator and the other end connected to a reactance network where the series physical resistor or the combination of physical resistors can be replaced with a short circuit when a desired value is zero;
   a shunt physical resistor or combination of physical resistors with one end connected to the control port of the circulator and the other end connected to ground,
   a reactance network connected between the end of the series physical resistor and one output terminal of the negative resistance network, the other terminal connected to ground; and
   wherein the reactance network is configured to be resonant at F0, and the reactance network is configured such that a signal at the input of the circulator will be amplified at the output of the circulator over a very narrow band of frequencies centered at F0.

3. The amplifier of claim 2, wherein the reactance network comprises a series resonator wherein, the series physical resistor is replaced with a short circuit.

4. The amplifier of claim 2, wherein the reactance network comprises a shunt resonator and the shunt physical resistor is removed.

5. An amplifier comprising:
   a negative resistance network comprising a network characterized by a negative ratio of a voltage between output terminals of the negative resistance network and to a current flowing out of the output terminals of the negative resistance network over a frequency band including F0, where one terminal of the negative resistance network can be connected to ground and the other terminal of the negative resistance network then designated as the output terminal of the negative resistance network;
   a reactance network whose resonant frequency is configured to be varied by means of a DC voltage;
   a bias network configured to present a DC voltage to the reactance network to vary the resonant frequency;
   a circulator having at least three ports, the at least three ports comprising an input port, an output port, and a control port, wherein a signal at an input port of the circulator will be amplified at an output port of the circulator over a very narrow band of frequencies centered at F0; and
   wherein:
      the amplifier is configured to vary F0 by varying the voltage supplied by the bias network while a gain of the amplifier remains constant without adjusting a value of the negative resistance or any other bias, and the reactance network includes a shunt resonator comprised of an inductor in shunt with a varactor.

6. An amplifier comprising:
   a negative resistance network comprising a network characterized by a negative ratio of a voltage between output terminals of the negative resistance network and to a current flowing out of the output terminals of the negative resistance network over a frequency band including F0, where one terminal of the negative resistance network can be connected to ground and the other terminal of the negative resistance network then designated as the output terminal of the negative resistance network;
   a reactance network whose resonant frequency is configured to be varied by means of a DC voltage;

a bias network configured to present a DC voltage to the reactance network to vary the resonant frequency;

a circulator having at least three ports, the at least three ports comprising an input port, an output port, and a control port;

a physical series resistor or combination of physical resistors with one end of each connected to the control port of a circulator and the other end of each connected to the reactance network, where the resistor can be replaced with a short circuit if a desired value of the resistor is zero;

a physical shunt resistor or combination of physical resistors with one end of each connected to a control port of a circulator and the other end of each connected to ground; and wherein a signal at an input port of the circulator will be amplified at an output port of the circulator over a very narrow band of frequencies centered at F0 and the amplifier is configured to vary F0 by varying the voltage supplied by the bias network while a gain of the amplifier remains constant, without adjusting a value of a negative resistance or any other bias.

7. The amplifier of claim 6, wherein the reactance network comprises a shunt resonator and the shunt physical resistor is removed.

8. The amplifier of claim 7, wherein the reactance network is comprised of an inductor in shunt with a varactor.

9. The amplifier of claim 6, wherein the reactance network comprises a series resonator and the physical series resistor is replaced with a short circuit.

10. The amplifier of claim 9, wherein the reactance network is comprised of an inductor in series with a varactor.

11. An amplifier comprising:

two negative resistance networks each characterized by a negative ratio of a voltage between output terminals of the negative resistance network and to a current flowing out of the output terminals of the negative resistance network over a frequency band including F0, where one terminal of each of the negative resistance networks can be connected to ground and the other terminal of each of the negative resistance networks designated as the output terminal of the negative resistance network;

a 3 dB directional coupler having four ports an input port, a coupled port, an isolated port and an output port, wherein identical impedances one connected to the coupled port and the other to output port determines a gain of the amplifier at the isolated port;

two identical reactance networks one connected between the coupled port of the 3 dB directional coupler and the output terminal of one of the negative resistance networks and the other one connected between the output port of the 3 dB directional coupler and the output terminal of the other negative resistance network; and wherein the reactance networks are configured to be resonant at F0 and are configured such that a signal at the input port of the 3 dB directional coupler will be amplified at the isolated port of the 3 dB directional coupler over a very narrow band of frequencies centered at F0.

12. The amplifier of claim 11, wherein each reactance network comprises an inductor in series with a capacitor.

13. The amplifier of claim 11, wherein each reactance network comprises an inductor in shunt with a capacitor, connected between the output terminal of one of the negative resistance networks and ground.

14. An amplifier comprising:

two negative resistance networks each characterized by a negative ratio of a voltage between the output terminals of the negative resistance network and to a current flowing out of the output terminals of the negative resistance network over a frequency band including F0, where one terminal of each of the negative resistance networks can be connected to ground and the other terminal of each of the negative resistance networks designated as the output terminal of the negative resistance network;

a 3 dB directional coupler having four ports an input port, a coupled port, an isolated port and an output port, wherein identical impedances one connected to the coupled port and the other to output port determines a gain of the amplifier at the isolated port;

two physical series resistor or combination of physical resistors with one end of one of the series resistors connected to the coupled port of the directional coupler and the other end connected to one of two reactance networks, and one end of the other series resistor connected to the output port of the directional coupler and the other end connected to the other reactance network;

two shunt physical resistors or combination of physical resistors with one end of one of the shunt resistors connected between the coupled port of the 3 dB directional coupler and ground and the other connected between the output port of the 3 dB directional coupler and ground, where the resistor can be deleted if a desired value of the resistors is very large;

two identical reactance networks whose resonant frequency is configured to be varied by means of a DC voltage, one connected between the coupled port of the 3 dB directional coupler and the output terminal of one of the negative resistance networks and the other connected between the output port of the 3 dB directional coupler and the output terminal of the other negative resistance network;

two bias networks each configured to present a DC voltage to one of the reactance networks to vary its resonant frequency; and wherein a signal at an input port of the directional coupler will be amplified at the isolated port of the directional coupler over a very narrow band of frequencies centered at F0, and the amplifier is configured to vary F0 by varying the voltage supplied by the bias network while a gain of the amplifier remains constant, without adjusting the value of the negative resistance or any other bias.

15. The amplifier of claim 14, wherein the reactance network comprises a shunt resonator and the shunt physical resistor is removed.

16. The amplifier of claim 15, wherein each of the shunt resonators comprises an inductor shunted by a varactor.

17. The amplifier of claim 14, wherein each of the reactance networks comprise a series resonator and the series resistor is replaced with a short circuit.

18. The amplifier of claim 17, wherein each of the series resonators comprises an inductor in series with a varactor.

* * * * *